(12) United States Patent
Barringer et al.

(10) Patent No.: US 6,971,893 B2
(45) Date of Patent: Dec. 6, 2005

(54) LINKAGE MECHANISM FOR A DOCKING CASSETTE FOR PRINTED CIRCUIT BOARDS

(75) Inventors: Dennis R. Barringer, Wallkill, NY (US); Shawn Canfield, Poughkeepsie, NY (US); Justin C. Rogers, Poughkeepsie, NY (US); Harold M. Toffler, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 106 days.

(21) Appl. No.: 10/726,103

(22) Filed: Dec. 2, 2003

(65) Prior Publication Data

US 2005/0118847 A1 Jun. 2, 2005

(51) Int. Cl.⁷ .......................... H01R 13/62; H01R 13/64
(52) U.S. Cl. ......................... 439/157; 439/377; 439/372
(58) Field of Search ................................ 439/152, 157, 439/158, 160, 372, 377

(56) References Cited

U.S. PATENT DOCUMENTS

| | | | | |
|---|---|---|---|---|
| 4,597,173 A | * | 7/1986 | Chino et al. ................... 29/741 |
| 5,085,583 A | * | 2/1992 | Amos et al. ................. 439/479 |
| 5,316,495 A | * | 5/1994 | Frantz ......................... 439/372 |
| 5,852,949 A | | 12/1998 | Cartensen .............. 74/424.8 A |
| 6,406,322 B1 | | 6/2002 | Barringer et al. ........... 439/377 |
| 6,493,235 B1 | | 12/2002 | Barringer et al. ........... 361/756 |
| 6,529,383 B1 | | 3/2003 | Barringer et al. ........... 361/754 |
| 6,608,759 B1 | | 8/2003 | Barringer et al. ........... 361/759 |

* cited by examiner

Primary Examiner—Chandrika Prasad
(74) Attorney, Agent, or Firm—Lily Neff; Floyd A. Gonzalez

(57) ABSTRACT

A docking apparatus for printed circuit boards including a cassette housing defining a housing cavity for containing a printed circuit board (PCB) and a linkage mechanism associated with the cassette housing. The linkage mechanism includes a linkage arm pivotally connected to the cassette housing via a pivot and has a first arm pivotally connected to the PCB, a traveler having a threaded bore therethrough connected to a second arm extending from the first arm, a shaft threadedly engaged in the left handed threaded bore through the traveler at a first end defining the shaft, the first end configured to operably transfer axial translation of the shaft to the traveler, and an opposite second end defining the shaft threaded engaged in a right handed threaded bore through a split nut operably secured to the cassette housing. The traveler and nut are configured to threadably receive corresponding threads of the shaft for axial translation of the shaft therethrough, wherein rotation of the shaft translates the shaft causing rapid pivotal movement of the linkage arm about the pivot via the traveler and nut, causing translation of the PCB in and out of engagement with a corresponding connector.

8 Claims, 10 Drawing Sheets

LINKAGE MECHANISM FOR A DOCKING CASSETTE FOR PRINTED CIRCUIT BOARDS

FIELD OF THE INVENTION

The present invention relates generally to a docking cassette for printed circuit boards and more specifically to a docking cassette for printed circuit boards that provides increased mechanical advantage and speed to drive the printed circuit board into mating engagement with a corresponding connector.

BACKGROUND OF THE INVENTION

As integrated circuit (IC) and printed circuit board (PCB) design and fabrication techniques become more sophisticated, computer system design techniques must also become more sophisticated. This is because as IC's and PCB's become more densely populated, their performance capabilities and speeds increase and computer systems which employ these IC's and PCB's must be able to support the increase in performance. In addition, as businesses that employ these computer systems and components become more sophisticated, they demand greater performance from their computer systems resulting in increasingly densely populated PCB's and computer systems having tightly packed packages. As a result of these tightly packed packages, these PCB's and computer systems are susceptible to a variety of problems which must be considered.

For example, as components and circuits become smaller, their packaging becomes smaller thus allowing manufacturers and designers to more densely populate boards and systems. However, with the smaller packaging and more densely populated boards comes more signal interconnections with less card edge real estate available. Further, the increased signal interconnections increase the required force to make such interconnections. It has become very difficult to create enough mechanical advantage with present docking systems to overcome the high plug forces due to the increased signal interconnections. The forces in some cases are in excess of one hundred pounds which is more than the mechanical advantage available in the present systems employed.

Further, as PCB's are packaged into cassettes, and the cassettes are disposed into frames in ever larger numbers, it becomes important to make the cassettes hotpluggable, so that failed PCB's may be replaced without disrupting the performance of unfailed PCB's. This hotpluggable capability means that power tools may not be used to unseat and seat connectors in the PCB's. Thus, speed in plugging large numbers of the cassettes and PCB's is need to allow a customer engineer to accomplish the required installation of new or failed PCB's and cassettes without undue fatigue.

Accordingly, there is a need to develop enough mechanical advantage to provide the forces and travel necessary to quickly and reliably seat and unseat the mating connectors associated with connecting and disconnecting, respectively, the PCB while maintaining a compact docking cassette.

BRIEF SUMMARY OF THE INVENTION:

A docking apparatus for printed circuit boards including a cassette housing so as to define a housing cavity for containing a printed circuit board (PCB) and a linkage mechanism disposed so as to be associated with the cassette housing. The linkage mechanism includes a linkage arm pivotally connected to the cassette housing via a pivot and has a first arm pivotally connected to the PCB, a traveler having a threaded bore therethrough is connected to a second arm extending from the first arm, a shaft threadedly engaged in the left handed threaded bore through the traveler at a first end defining the shaft, the first end configured to operably transfer axial translation of the shaft to the traveler, and an opposite second end defining the shaft threaded engaged in a right handed threaded bore through a split nut operably secured to the cassette housing. The traveler and nut are configured to threadably receive corresponding threads of the shaft for axial translation of the shaft therethrough, wherein rotation of the shaft translates the shaft causing rapid pivotal movement of the linkage arm about the pivot via the traveler and nut, causing translation of the PCB in and out of engagement with a corresponding connector.

BRIEF DESCRIPTION OF THE SEVERAL VIEWS OF THE DRAWING

These and other objects will be apparent to one skilled in the art from the following detailed description of the invention taken in conjunction with the accompanying drawings in which.

DETAILED DESCRIPTION OF THE INVENTION

The cassette of the present invention is similar to the cassette disclosed in copending U.S. patent application Ser. No. 10/688,525 filed Oct. 17, 2003 for A DOCKING CASSETTE FOR PRINTED CIRCUIT BOARDS, assigned to the assignee of the present application, and incorporated herein by reference.

Figure 1:
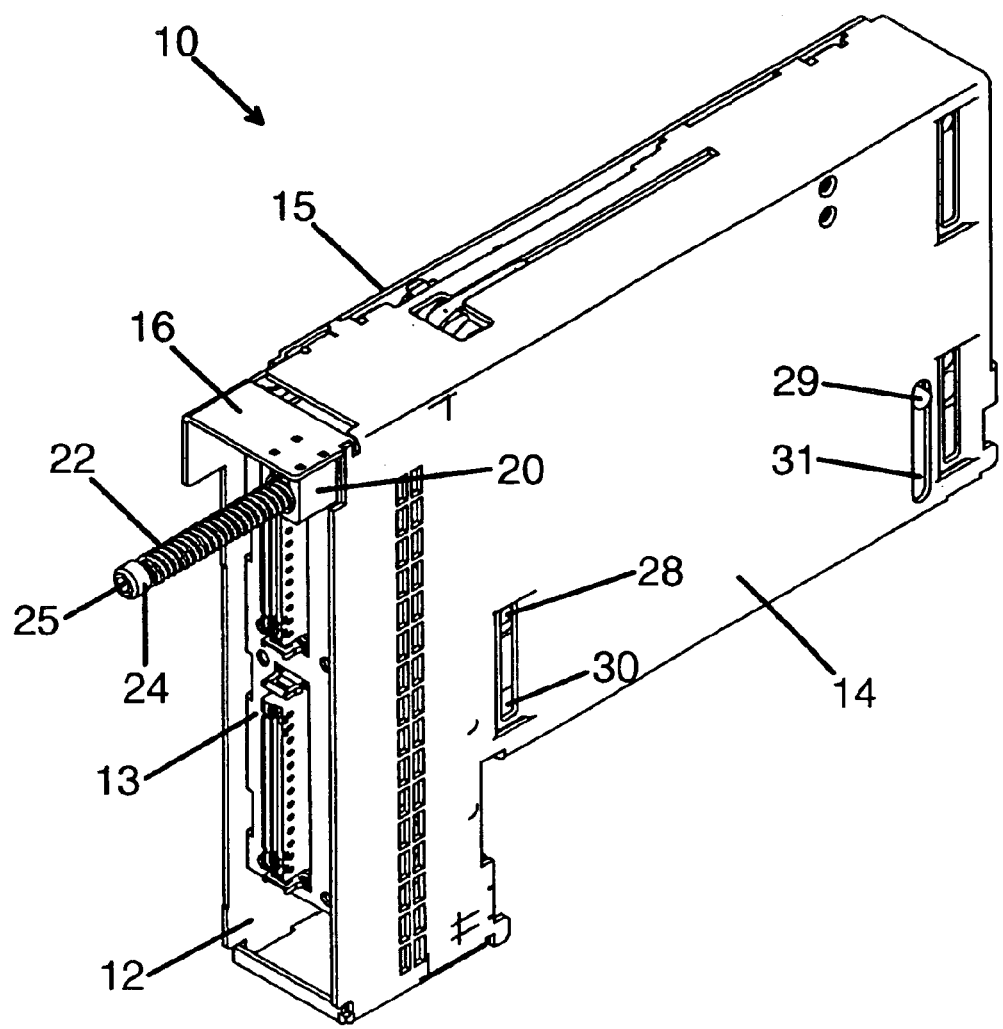
FIG. 1 is a perspective view of a cassette having defined therein a cavity containing a printed circuit board.

FIG. 1 is a perspective view of a cassette 10 having defined therein a cavity 12 containing a carrier 13 for carrying a printed circuit board (PCB). The cassette has a cover 14 and a back 15. The back 15 has a folded over tab 16 to which is welded a split nut 20. A rod 22 is threaded through a threaded bore in the split nut 20. An enlarged head 24 on one end of the rod 22 has a socket 25 into which is inserted a tool such as an Allen wrench to turn the rod 22 to activate the mechanism for seating the PCB, as will be discussed. Projections 28 and 29 extend from the carrier 13 within the cassette 10 through respective slots 30 and 31 to align the carrier 13 as it is moved up and down by the mechanism in the cassette 10, as will be discussed.

Figure 2:
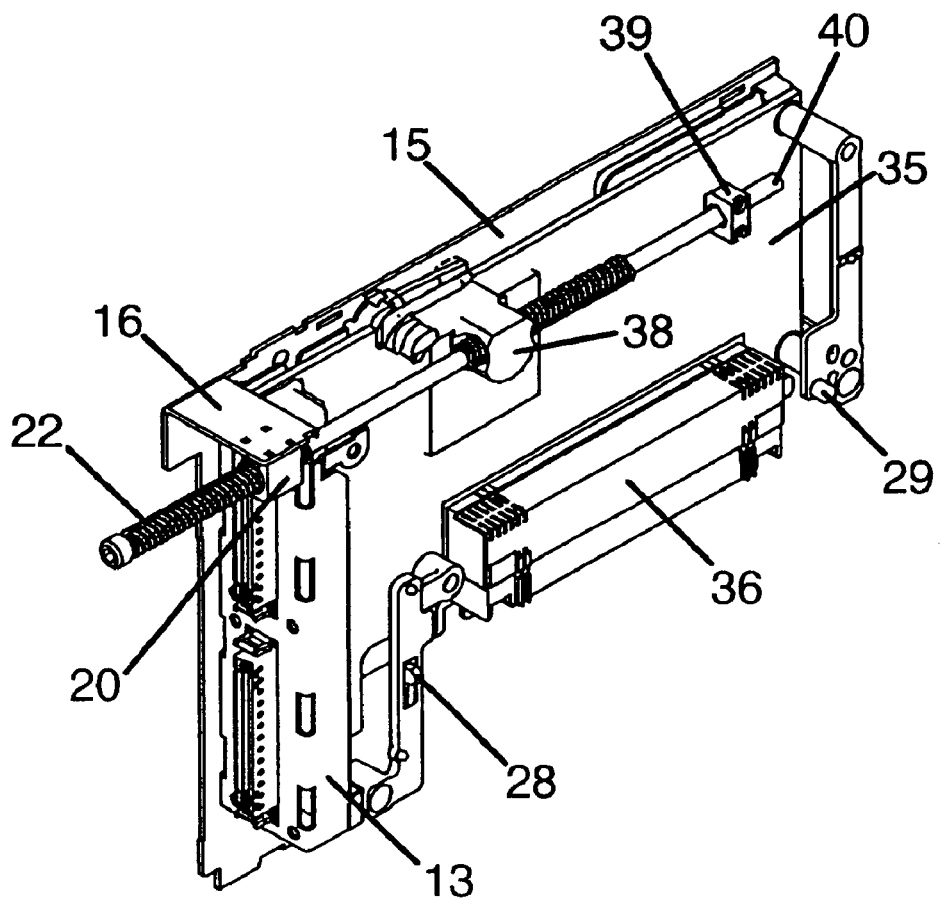
FIG. 2 is a perspective view of the cassette of FIG. 1 with the cover removed.

FIG. 2 is a perspective view of the cassette 10 of FIG. 1 with the cover 14 removed. The carrier 13 carries a PCB 35 on which are mounted electrical components (not shown) and an electrical connector 36. The mechanism, to be described, moves the carrier 13 and PCB 35 downwardly, seating the connector 36 into a corresponding electrical connector (not shown), or upwardly, unseating the electrical 36, depending on the rotation of the rod 22, to be discussed. The operating mechanism includes the rod 22, the split nut 20, and a traveler 38, which is free to move backwardly and forwardly as the rod 22 is turned. A guide 39 is attached to the PCB 35, and has a smooth bore for allowing the free end 40 of the rod 22 to move freely therethrough as the rod is moved.

Figure 3:
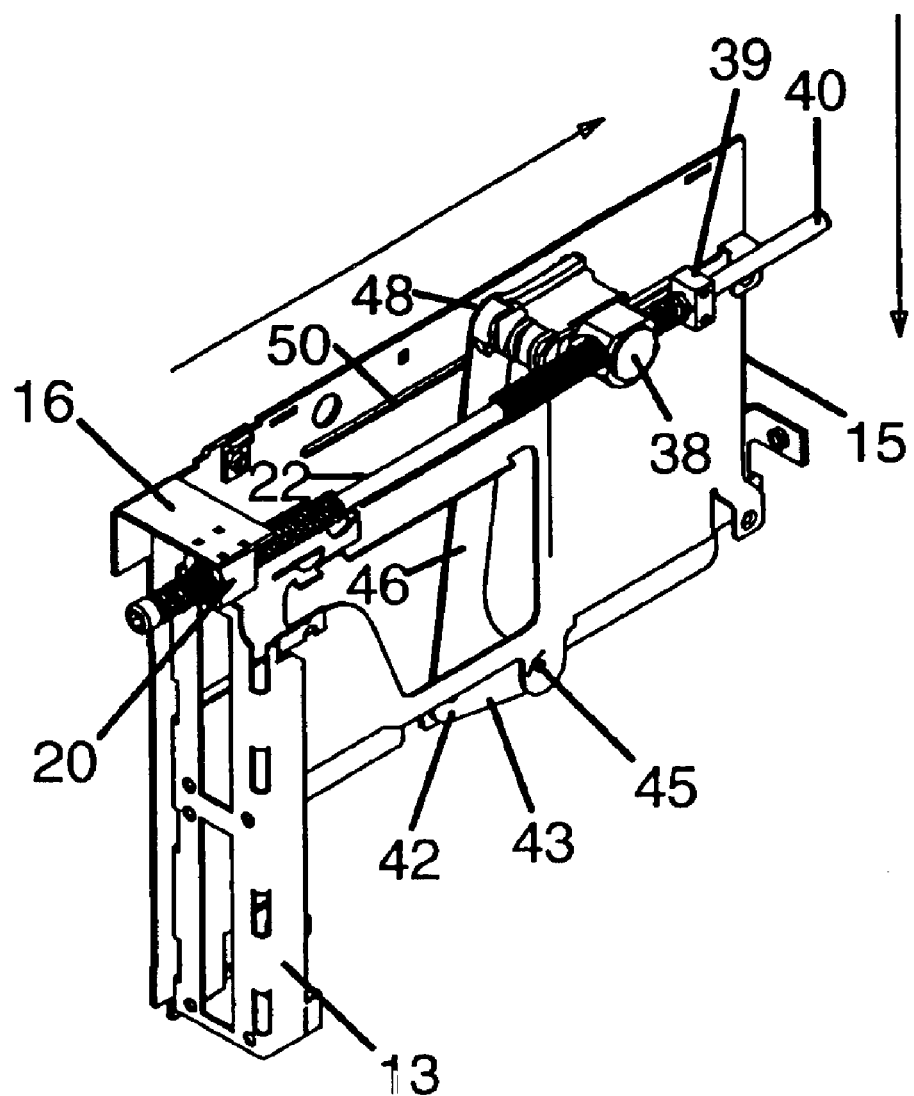
FIG. 3 is a perspective view of the cassette of FIG. 1 with the cover and printed circuit board removed showing the operating mechanism for seating and unseating the printed circuit board.

FIG. 3 is a perspective view of the cassette 10 of FIG. 1 with the cover 14 and PCB 35 removed and the carrier 13 partially cut away, showing the operating mechanism for seating and unseating the PCB 35. The mechanism includes a bell crank 42 having a first arm 43 pivotally connected to the carrier 13 at 45, and a second arm 46 pivotally connected the traveler 38 at 48. The bell crank 42 has a pin (not shown) extending into a horizontal slot 50 in the back 15 of the cassette 10 to guide the movement of the traveler 38. As will be discussed, the rod is threaded through the split nut 20 and the traveler 38 such that when the rod is rotated in the clockwise direction, the traveler moves toward the right, rotating the bell crank 42 to the right, and moving the carrier 13 downwardly.

Figure 4:
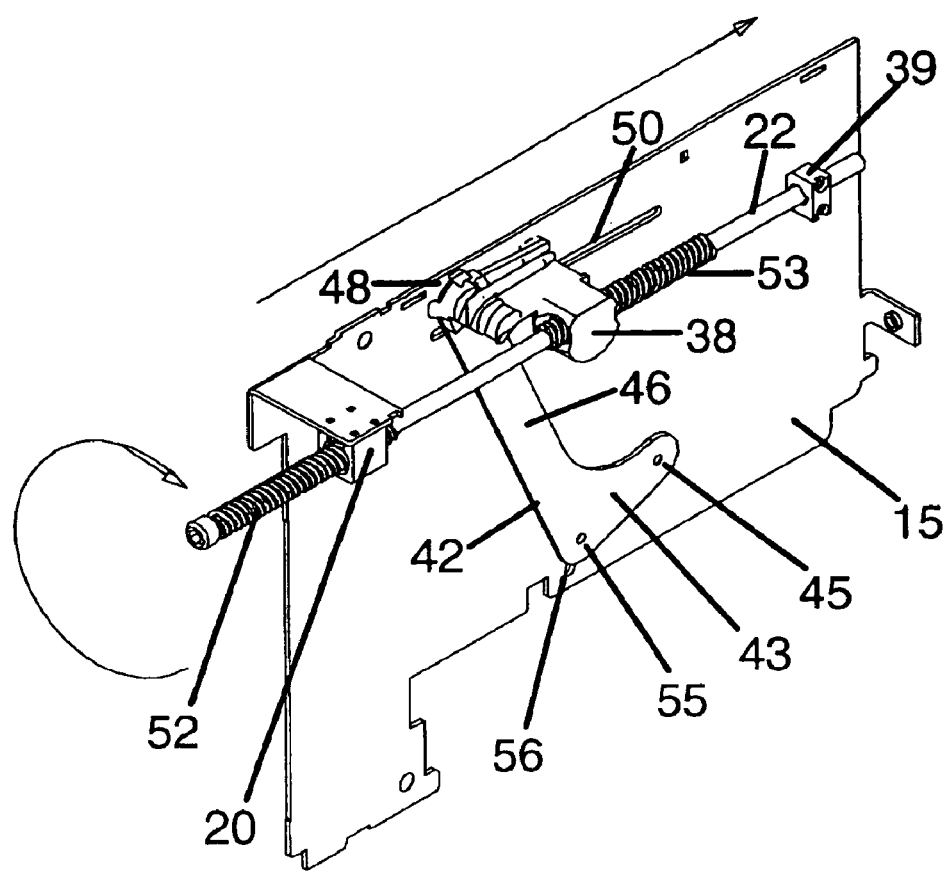
FIG. 4 is a partial view of the operating mechanism of the cassette of FIG. 1.

FIG. 4 is a partial view of the operating mechanism of the cassette 10 of FIG. 1. The rod 22 has a first enlarged portion 52 which is threaded with a right hand thread. Thus, when the rod is turned clockwise, the rod 22 advances in the split nut 20 and moves the traveler 38 toward the right. The rod 22 also has a second enlarged portion 53 which has a left hand thread. Thus, as the rod 22 is turned clockwise, the traveler 38 further moves to the right. It will be understood that the action of both threaded portions 52 and 53 in the split nut 20 and threaded bore in the traveler 38 will act together in an additive action to rapidly move the traveler 38 to the right. The bell crank 42 is pivotally attached by a pin 55 to the back 15. The pin rides in a slot 56 in the back which allows the bell crank 42 to move with respect to the back 15 so that the carrier 13 shown in FIGS. 2 and 3 may move straight down as the traveler 38 is moved to the right.

Figure 5:
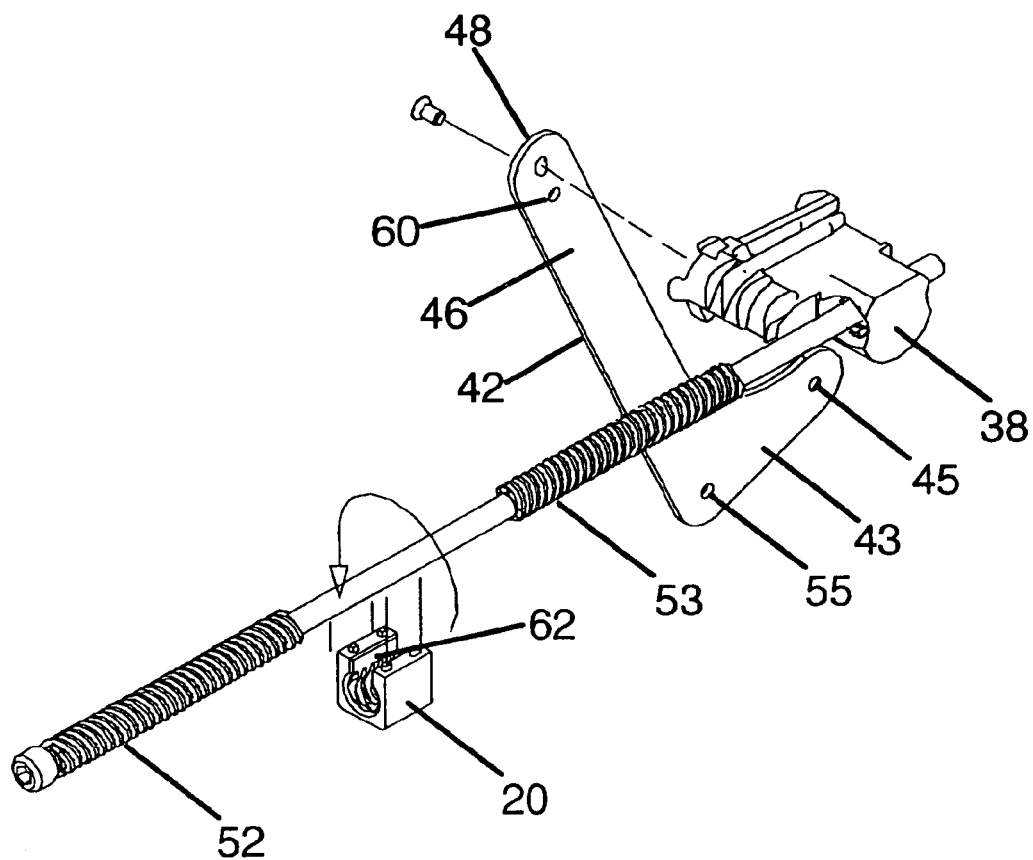
FIG. 5 is a partial exploded view of FIG. 4 showing the action of the rod, bell crank, split nut and threaded traveler.

FIG. 5 is a partial exploded view of FIG. 4 showing the assembly of the rod 22, bell crank 42, split nut 20 and threaded traveler 38. The end 48 of the second arm 36 of the bell crank 42 is pivotally pined to the back of the traveler 38. The pin at the end 45 of the first arm of the bell crank 42 pivotally pins the bell crank 42 to the carrier 13. A pin at 55 extends into slot 56 in the back 15, and a pin at 60 extends into slot 50 in the back 15, to align the movement of the traveler 38 and carrier 13, as explained. The split nut 20 has a slot 62 lengthwise through the split nut 20 which allows the split nut 20 to slip over the reduced portion of the rod between the two threaded portions 52 and 53. The split nut is then threaded onto the threaded portion 52, and then welded to the tab 16, as shown in FIG. 1. It will be understood even though the slot 62 interrupts the threads in the nut 20, there is enough material left around the circumference of the bore through the nut 20 that the operation of the threads 52 and the nut 20 is not affected.

Figure 6:
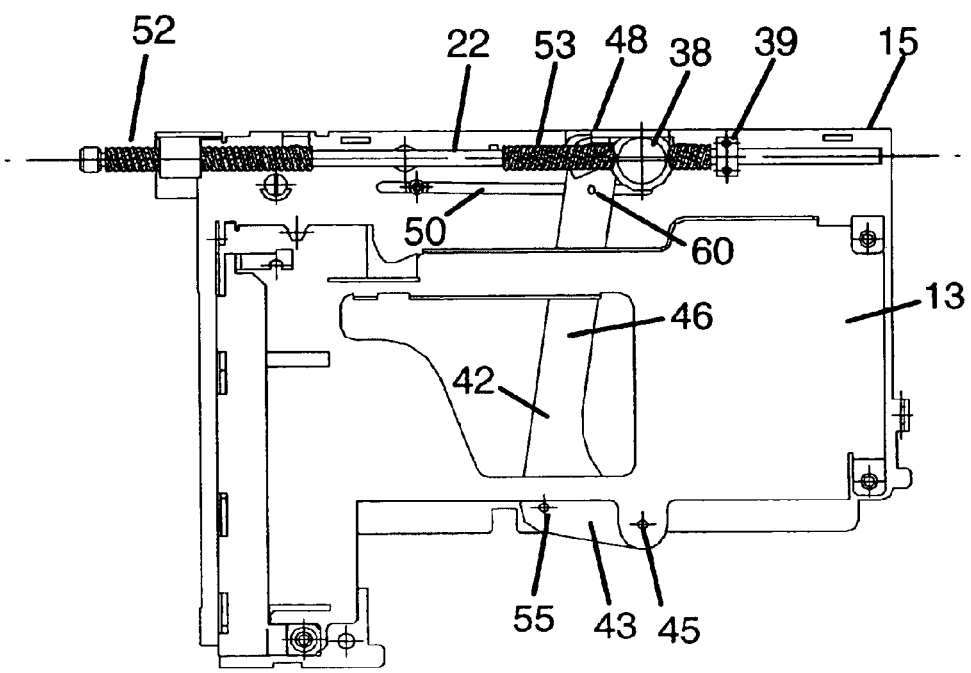
FIG. 6 is a front elevation of the operating mechanism of FIG. 4 showing the operating mechanism in the seated position.

FIG. 6 is a front elevation of the operating mechanism of FIG. 4 showing the operating mechanism in the seated position. The rod 22 is at the full right hand position, moving the end 48 of the second arm 46 fully to the right, and the end 45 of the first arm 43 to the full down position. The pin at 60 of the second arm rides in the slot 50 to the right end of the slot.

Figure 7:
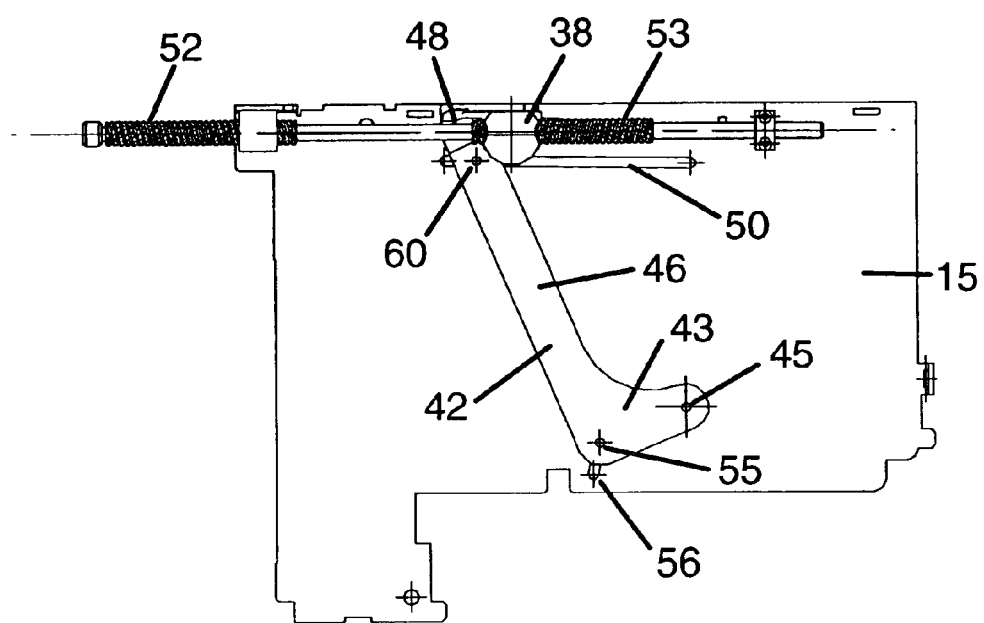
FIG. 7 is a front elevation of the operating mechanism of FIG. 4 showing the operating mechanism in the unseated position.

FIG. 7 is a front elevation of the operating mechanism of FIG. 4 showing the operating mechanism in the unseated position. In this position, the rod 22 is at the fully left or unscrewed position. The end of 48 of the second arm 46 is fully to the left, and the end 45 of the first arm is fully up, unseating the connector 36 of the PCB 35 in the carrier 13. The pin at 60 is at the left end of the slot 50, and the pin 55 is at the top of the slot 56.

Figure 8:
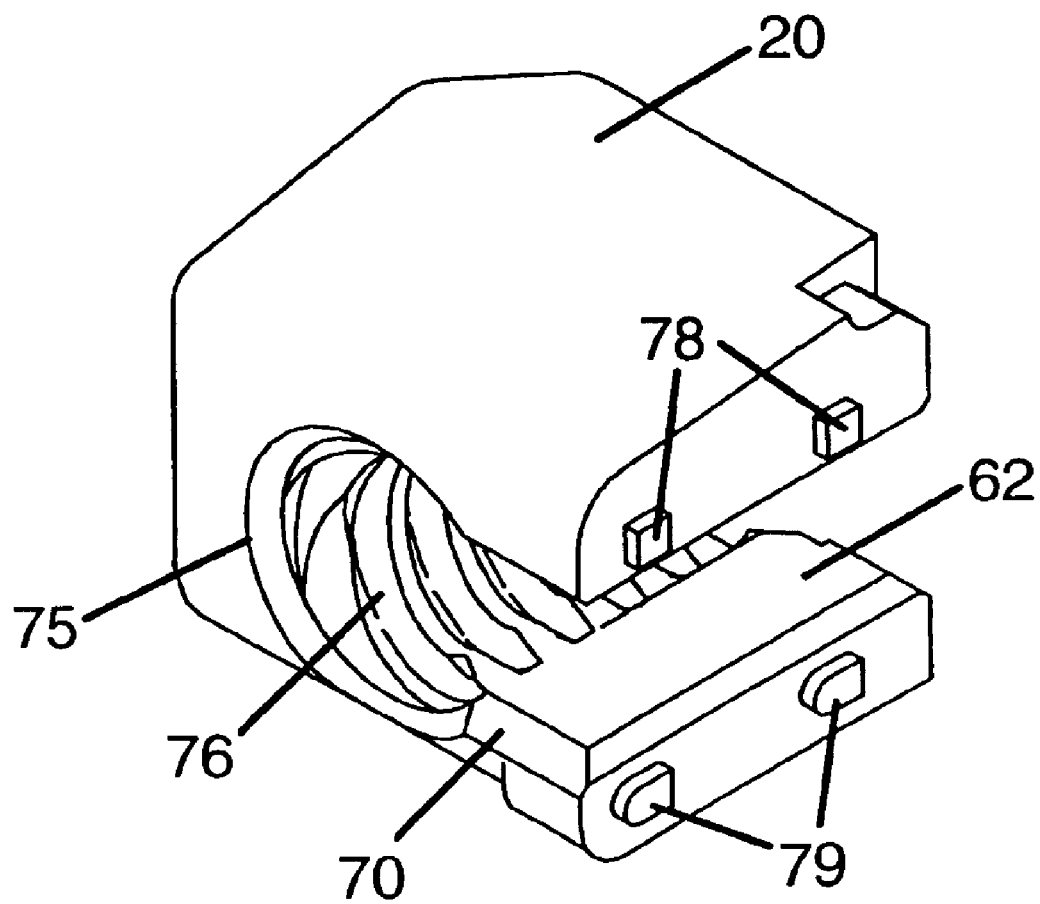
FIG. 8 is a perspective view of the split nut of the operating mechanism of FIGS. 4–7.

FIG. 8 is a perspective view of the split nut 20 of the operating mechanism of FIGS. 4–7. The split nut 20 includes a slot 62 lengthwise through the nut 20. As mentioned previously, there is enough material 70 around the circumference of the bore 75 of the nut 20, that the action of the threads 76 of the nut 20 function correctly with the threaded portion 52 of the rod 22. The split end of the nut 20 is flattened and contains projections 78 and 79 which fit into corresponding holes in the tab 16. The projections 78 and 79, and the corresponding holes may be polarized, if desired.

Figure 9:
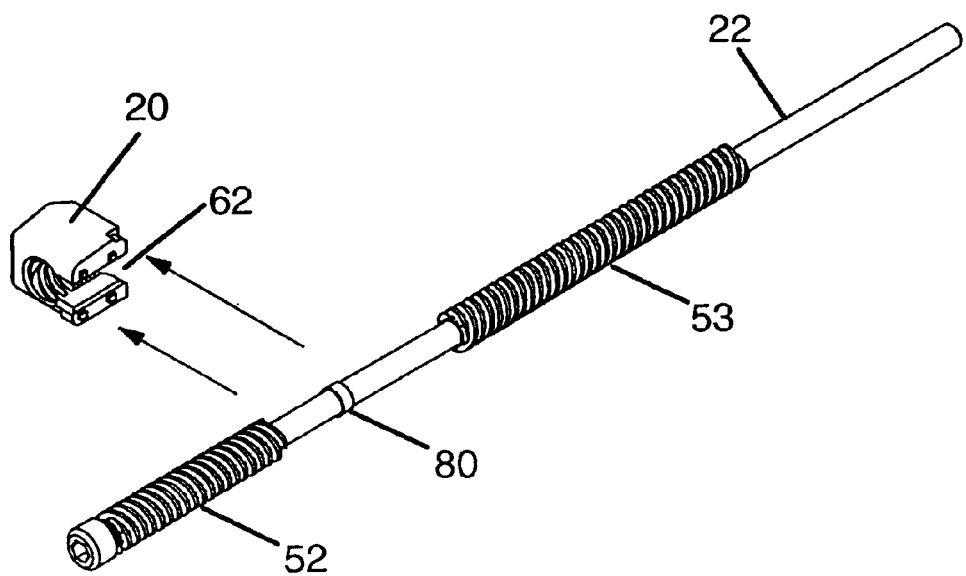
FIG. 9 is an exploded view showing the split nut and rod of the operating mechanism of FIG. 4.

FIG. 9 is an exploded view showing the split nut 20 and rod 22 of the operating mechanism of FIG. 4. The slot 22 is sized such that the split nut 20 may be slipped over the rod 22 and threaded into place. If desired, an enlarged ring 80 may be formed around the circumference of the rod 22 intermediate the threaded portions 52 and 53. A spring (not shown) may be trapped between the ring 80 and the back side of the nut 20, to provide tension on the rod, to urge the rod toward the unseated position, assisting in the smoothness of the action of the operating mechanism.

Figure 10:
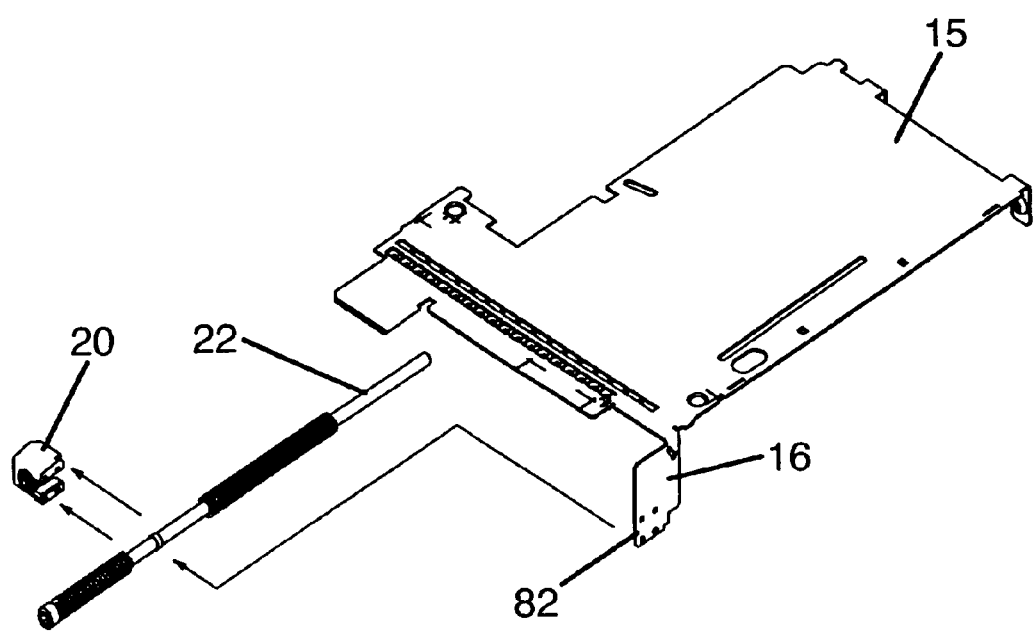
FIG. 10 is an exploded view showing the rod, split nut and back of the cassette of FIG. 1.

FIG. 10 is an exploded view showing the rod 22, split nut 20 and back 15 of the cassette 10 of FIG. 1. After the split nut 20 is placed on the rod 22 and threaded into place, the flat face of the split nut 20 is fastened to the tab 16 of the back 15. The may be done by welding, epoxy, or any other method desired. The tab 16 may include holes 80 corresponding to the projections 78 and 79 to properly align the split nut 20 on the tab 16.

The use of the multiple cassettes 10 in a frame are shown and explained in the aforementioned 10/688,525 patent application.

While the preferred embodiment of the invention has been illustrated and described herein, it is to be understood that the invention is not limited to the precise construction herein disclosed, and the right is reserved to all changes and modifications coming within the scope of the invention as defined in the appended claims.

What is claimed is:

1. An apparatus comprising:
   a cassette carrying an electronic module having a connector movable between a seated position completing an electrical connection and an unseated breaking the electrical connection;
   an operating mechanism for moving the electronic module between the seated and unseated positions;
   a traveler member connected to the operating mechanism, said traveler member movable between a first position wherein the operating mechanism moves the electronic module to the seated position and a second position wherein the operating mechanism moves the electrical module to the unseated position, said traveling member having a threaded bore therethrough;

a nut attached to the cassette, said nut having a threaded bore therethrough;

a rod having two threaded portions thereon, the first threaded portion threadedly engaged with the threaded bore through said traveler member, and the second threaded portion threadedly engaged with the threaded bore through said nut, said threaded portions and threaded bores being threaded such that rotation of said rod in a first direction screws the rod in a first direction in said nut and screws the rod in a second direction in said traveler member such that the motion of the traveler member is increased by both the screwing action of the rod in the nut and the screwing action of the rod in the traveler member.

2. The apparatus of claim 1 wherein the threads of the first threaded portion of the rod and the threaded bore of the nut are right handed threads, and the threads of the second threaded portion of the rod and the threaded bore of the traveler member are left handed threads.

3. The apparatus of claim 1 wherein the rod has a proximal end extending from the cassette and a distal end within the cassette;

an enlarged head on the proximal end of the rod formed for accepting a tool for turning the rod; and a guide member mounted on the electronic module and having a smooth bore therethrough for sliding engagement with the distal end of the rod.

4. The apparatus of claim 1 wherein said operating member includes a bell crank pivotally mounted with the cassette, said bell crank having a first arm connected to the traveler member and a second arm connected to the electronic module such movement of the traveler member between its first and second positions moves the electronic module between its seated and unseated positions.

5. The apparatus of claim 4 further comprising guide members for guiding the electronic module as the operating mechanism moves the electronic module between its seated and unseated positions.

6. The apparatus of claim 5 wherein the guide members comprise pins on the electronic module extending into slots in the cassette.

7. The apparatus of claim 1 wherein said rod has an enlarged shoulder intermediate the two threaded portions, said enlarged shoulder for trapping a spring member between the enlarged shoulder and said nut for applying tension on the rod.

8. An method comprising:

carrying an electronic module within a cassette, the electronic module having a connector movable between a seated position completing an electrical connection and an unseated breaking the electrical connection;

rotating a rod having two threaded portions thereon, the first threaded portion threadedly engaged with a threaded bore through a traveler member, and the second threaded portion threadedly engaged with a threaded bore through a nut attached to the cassette, said threaded portions and threaded bores being threaded such that rotation of said rod in a first direction screws the rod in a first direction in said nut and screws the rod in a second direction in said traveler member such that the motion of the traveler member is increased by both the screwing action of the rod in the nut and the screwing action of the rod in the traveler member; and moving the traveler member connected to an operating mechanism between a first position wherein the operating mechanism moves the electronic module to the seated position and a second position wherein the operating mechanism moves the electrical module to the unseated position.

* * * * *